United States Patent [19]
Lee et al.

[11] Patent Number: 6,153,471
[45] Date of Patent: Nov. 28, 2000

[54] METHOD OF FABRICATING FLASH MEMORY

[75] Inventors: Claymens Lee, Fengshan; Gary Hong, Hsinchu, both of Taiwan

[73] Assignee: United Semiconductor Corp., Hsinchu, Taiwan

[21] Appl. No.: 09/313,511

[22] Filed: May 17, 1999

[30] Foreign Application Priority Data

Mar. 29, 1999 [TW] Taiwan .................................. 88104904

[51] Int. Cl.[7] ............................................... H01L 21/8247
[52] U.S. Cl. ............................................. 438/263; 438/564
[58] Field of Search ...................... 438/257–267, 438/564

[56] References Cited

U.S. PATENT DOCUMENTS

| 6,057,195 | 5/2000 | Wu | 438/275 |
| 6,063,668 | 5/2000 | He et al. | 438/264 |

*Primary Examiner*—Richard Booth
*Attorney, Agent, or Firm*—Jiawei Huang; J.C. Patents

[57] ABSTRACT

A method of fabricating a flash memory. After the formation of a trench isolation structure, openings are formed, in a direction perpendicular to the orientation of the trench isolation structure, in order to form a buried bit line. A spacer is formed on the opening sidewall of the bit line in which the distance between a top of the spacer and the interface of a substrate and a pad oxide layer is the depth of the source/drain region. The opening is then filled with a doped polysilicon conducting layer used as the buried bit line. The dopant from the polysilicon conducting layer is driven into the substrate to form the source/drain region.

12 Claims, 6 Drawing Sheets

METHOD OF FABRICATING FLASH MEMORY

CROSS-REFERENCE TO RELATED APPLICATION

This application claims the priority benefit of Taiwan application serial no. 88104904, filed Mar. 29, 1999, the full disclosure of which is incorporated herein by reference.

BACKGROUND OF THE INVENTION

1. Field of Invention

The present invention relates to a method of fabricating a flash memory, more particularly to a method of fabricating a flash memory with a Shallow Trench Isolation (STI) process.

2. Description of Related Art

In the conventional flash memory structure, a gate includes a floating gate to store charge and a control gate to control the data access. The floating gate is located between the control gate and a substrate and is in a floating situation. The floating gate is not connected to any other circuits, while the control gate is connected to a word line. The control gate of the flash memory cell is connected to the word line, while the drain of each flash memory cell is connected to the bit line, in order to control each flash memory cell.

However, the conventional process for fabricating the flash memory employs a field oxide layer as an electrical isolation for the flash memory. Since the field oxide layer acting as the electrical isolation can occupy too much space in the substrate, it is therefore necessary to fabricate a flash memory with a minimum size, in order to improve the device integration.

SUMMARY OF THE INVENTION

The purpose of the present invention is to provide a method of fabricating the flash memory, which comprises a first oxide layer and a patterned first masking layer formed on the substrate surface. With the first masking layer as a mask, a strip-like trench isolation structure is formed in the substrate. A strip-like opening is formed in the substrate with its orientation perpendicular to the trench isolation structure, wherein the opening includes a first portion that crosses the masking layer and exposes the substrate, and a second portion that crosses the strip-like trench isolation structures and does not expose the substrate. On a sidewall of the opening, an insulating spacer is formed which does not completely cover the sidewall of the opening. The opening is filled with a doped first conducting layer and the dopant in the doped first conducting layer is driven into the substrate to form a source/drain region. The first masking layer and the first oxide layer are removed before a tunneling oxide layer is formed on the substrate, the source/drain region, and the first conducting layer. Next, the floating gate and the control gate are formed as follows: on the tunneling oxide layer, a patterned second conducting layer is formed to be approximately parallel to the first conducting layer and at least corresponding to the source/drain region, respectively. A dielectric layer is formed at least on the surface of the second conducting layer. A third conducting layer is formed. The third conducting layer is defined to form a strip-like control gate, which is approximately perpendicular to the first conducting layer. The dielectric layer and the second conducting layer are continually defined, enabling the second conducting layer to form the floating gate.

According to the present embodiment, the distance between the top of the spacer and the interface of the substrate and the first oxide layer is the depth of the source/drain region. The top surface of the first conducting layer has a higher interface than the substrate and the first oxide layer. The dopant in the first conducting layer is driven into the substrate to form the source/drain region, by methods including heat diffusion.

Accordingly, the distance between the top of the spacer from the opening of the buried bit line and the substrate and the interface of the first oxide layer is the depth of the source/drain region. In other words, the distance between the top of the spacer and the interface of the substrate and the first oxide layer controls the depth of the source/drain region from the flash memory of the present invention. Therefore, the device has a better efficiency. The source/drain region is formed by driving the dopant into the first conducting layer used as the buried bit line, thus protecting the lattice array of the substrate from any damage. This improves the reliability of the device. In addition, the buried bit line of the present invention is a doped polysilicon, and therefore has a lower resistance.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
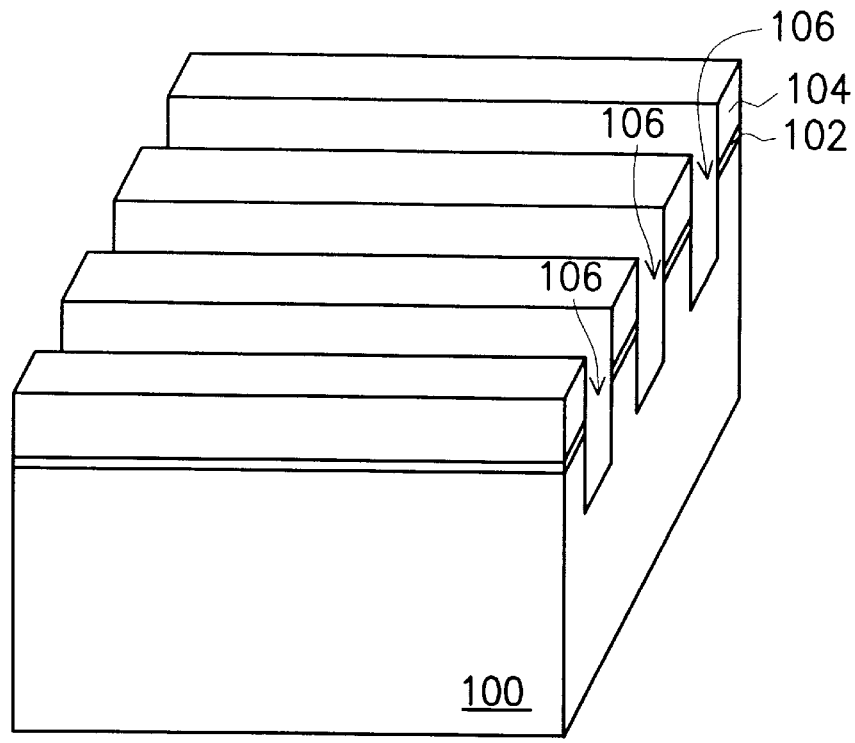
FIGS. 1A to 1F are three-dimensional diagrams showing the process flow for flash memory fabrication according to the preferred embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1F are three-dimensional diagrams showing the process flow for flash memory fabrication with the STI process according to the preferred embodiment of the invention.

Referring to FIG. 1A, a substrate 100 is provided, in this case, a silicon semiconductor substrate. A pad oxide layer 102 is formed by heat oxidation on the surface of the substrate 100, to protect the surface of the substrate 100. A patterned masking layer 104 is then formed on the pad oxide layer 102, so as to form a long strip-like trench 106 in the substrate 100. The material for the masking layer 104, in this case, includes $SiN_x$, while the depth of the trench is about 3500 to 4500 Å.

Figure 1B:
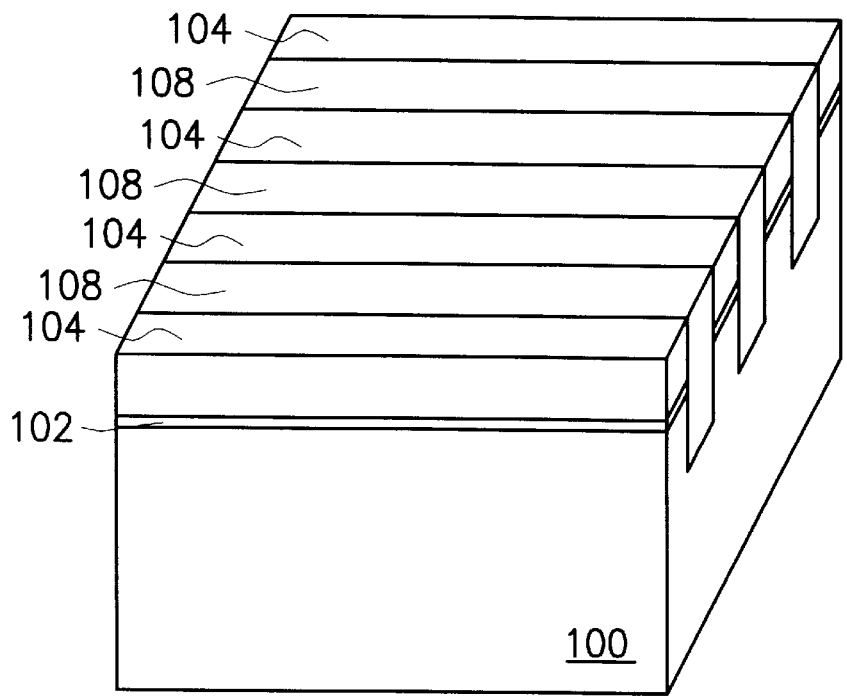

Referring to FIG. 1B, the trench 106 is filled with an insulating layer 108 such as the oxide for an electrical isolation. The method, in this case, involves a conventional trench process to form the trench isolation structure 108, which will not be described in detail here.

Figure 1C:
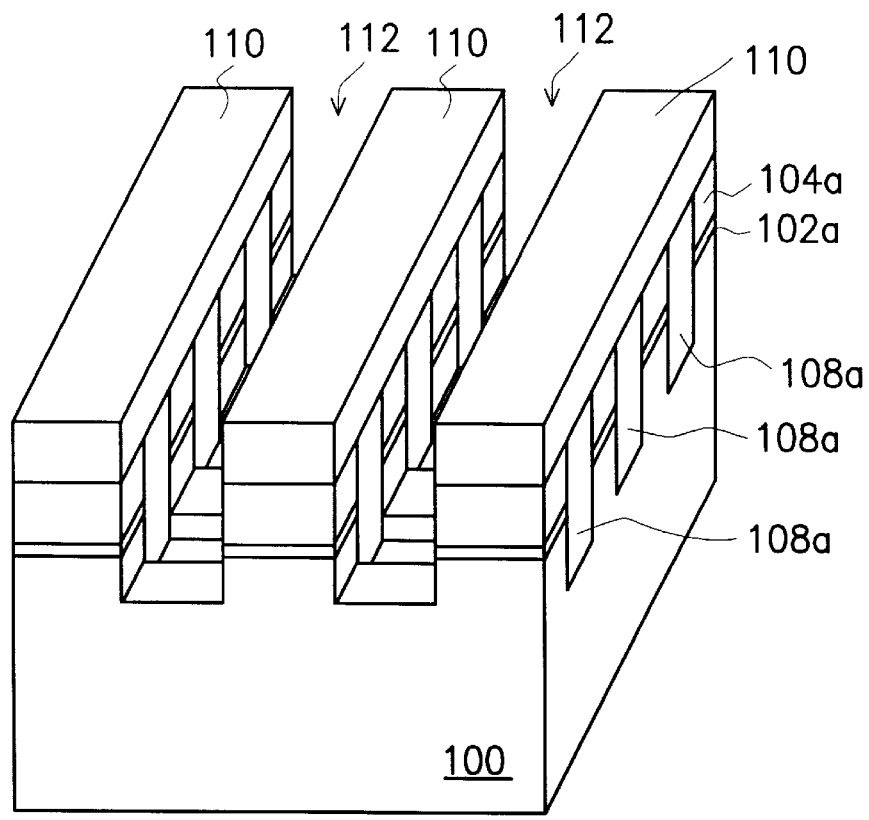
Figure 2A:
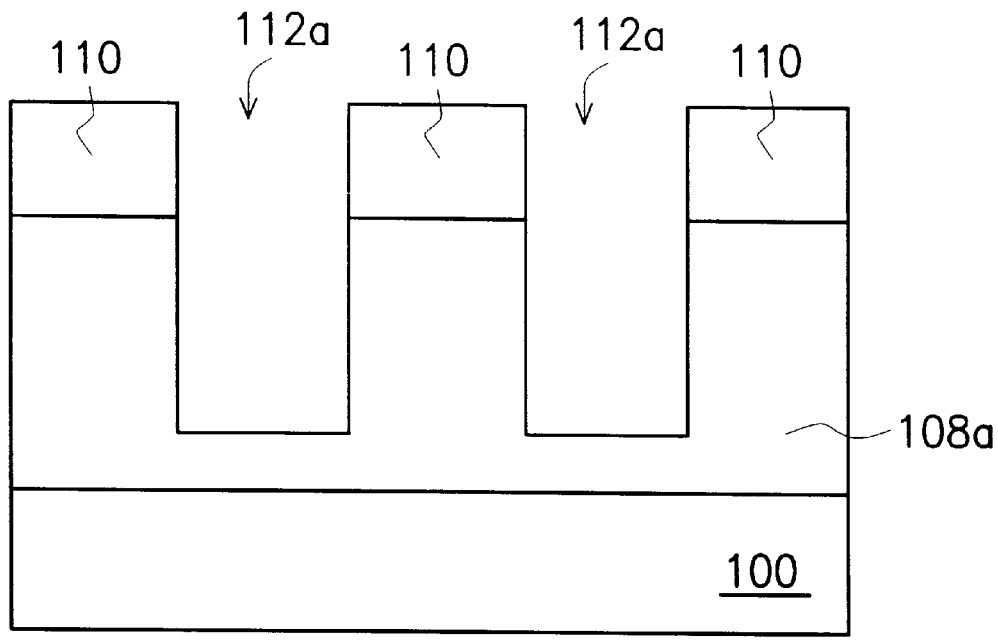
FIGS. 2A and 2B are cross-sectional diagrams showing the substrate which is parallel to the trench isolation structure and corresponds to the trench forming the masking layer. These diagrams correspond to FIGS. 1C and 1D.
Figure 3A:
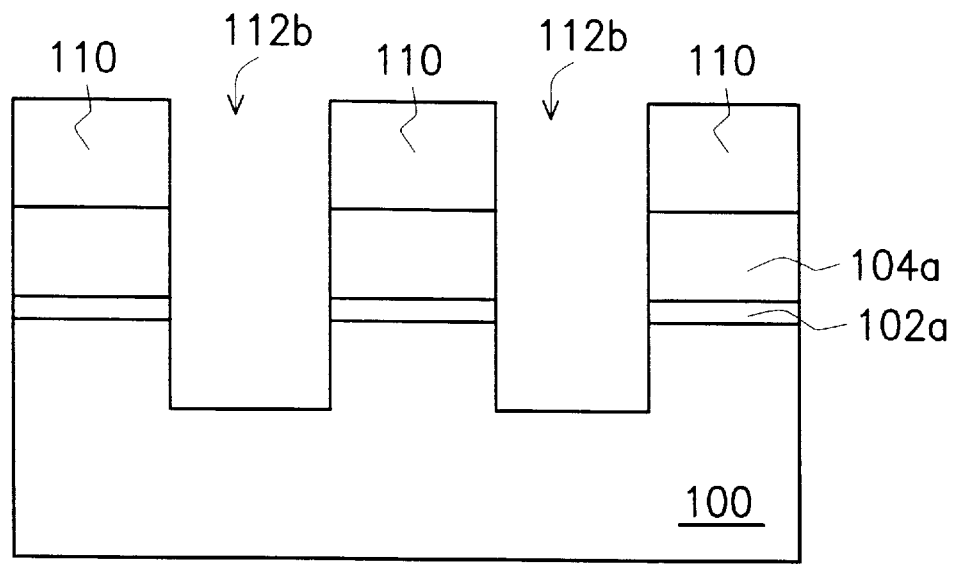
FIGS. 3A and 3B are cross-sectional diagrams showing the substrate that corresponds to the trench isolation structure. These diagrams correspond to FIGS. 1C and 1D.
Figure 4A:
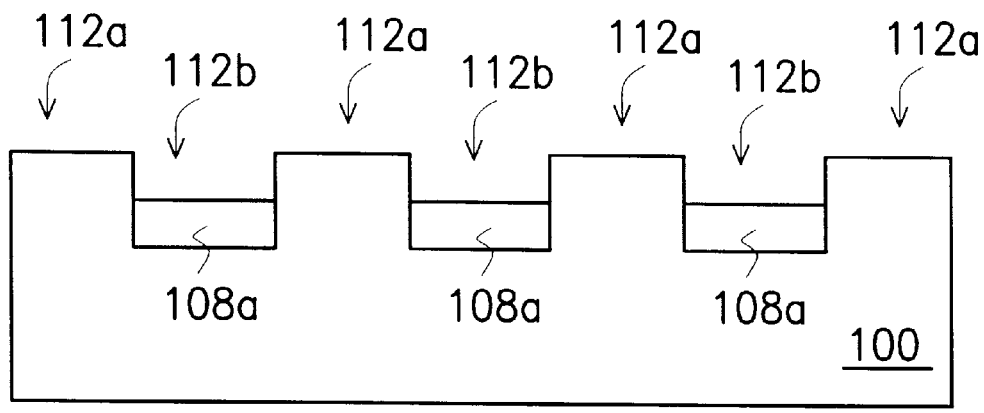
FIGS. 4A and 4B are cross-sectional diagrams showing the substrate that is perpendicular to the trench isolation structure and corresponds to the buried bit line pattern. These diagrams correspond to FIGS. 1C and 1D.

Reference is made to FIG. 1C, while simultaneously referring to FIGS. 2A, 3A, and 4A. FIG. 2A is a cross-sectional diagram of the substrate 100, which is parallel and corresponding to the trench isolation structure 108. FIG. 3A is a cross-sectional diagram of the substrate 100, which is parallel to the trench isolation structure 108 and is corresponding to the masking layer 104. FIG. 4A is a cross-sectional diagram of the substrate 100, which is perpendicular to the trench isolation structure 108 and is corresponding to the opening 112. A masking layer 110 which had a bit line pattern is formed on the whole substrate 100. The pattern of masking layer 110 is almost perpendicular to the trench isolation structure 108 (FIG. 1B). With the masking layer 110 acting as an etching mask, an anisotropic etching is performed to form a long stripped opening 112 in the substrate 100, wherein the opening 112 includes a first portion that crosses the masking layer 110 and exposes the substrate 100, and a second portion that crosses the trench isolation structures 108 and does not expose the substrate 100. This changes the masking layer 104, pad oxide layer 102, and the trench isolation structure 108 into the masking layer 104a, pad oxide layer 102a, and the trench isolation structure 108a. The opening 112 can be further divided into the opening 112a (FIG. 2A) which corresponds to the trench isolation structure 108a and the opening 112b (FIG. 3A) which exposes the surface of the substrate 100, wherein the opening 112a is deeper than the opening 112b. In addition, the opening 112a can be etched without completely removing the insulating material in the trench isolation structure 108a. In the diagram of the present embodiment, the insulating material can certainly be removed completely, up to or even deeper than the surface of the substrate 100.

Figure 1D:
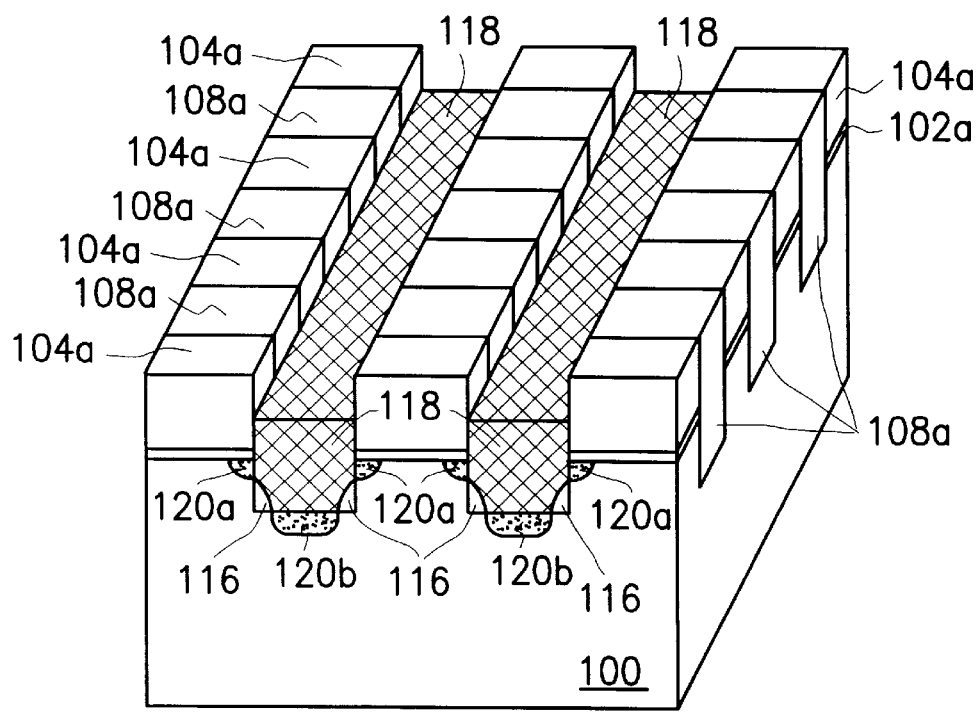
Figure 2B:
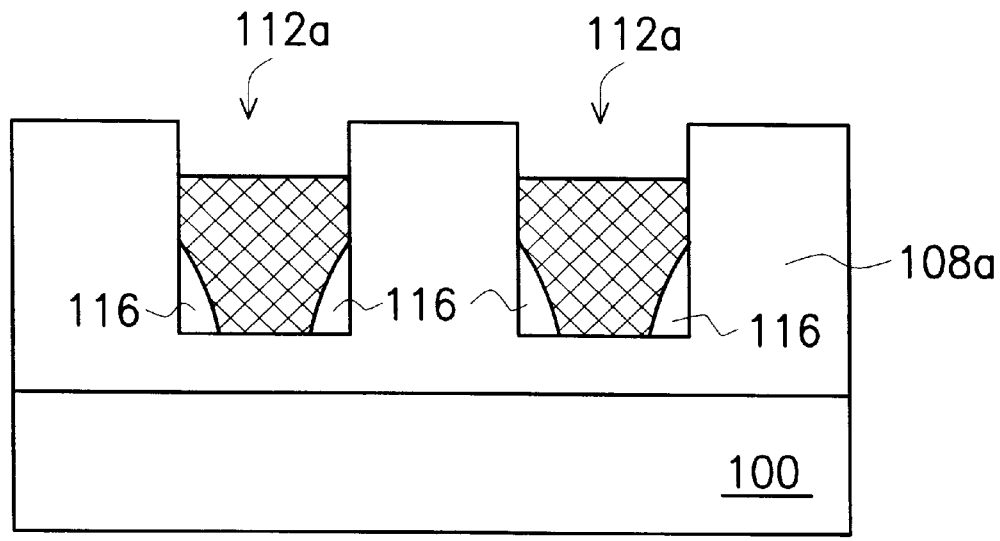
Figure 3B:
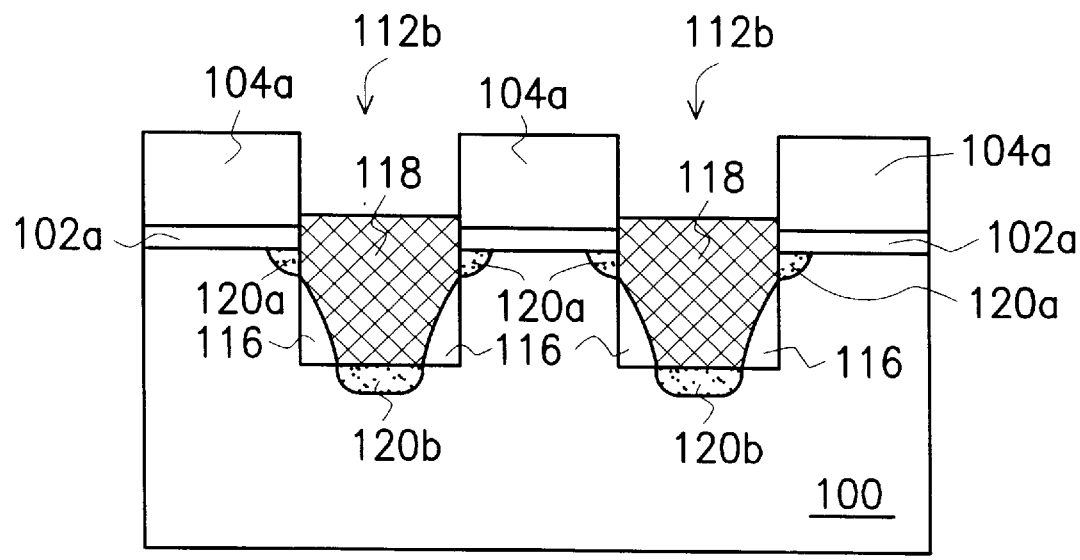
Figure 4B:
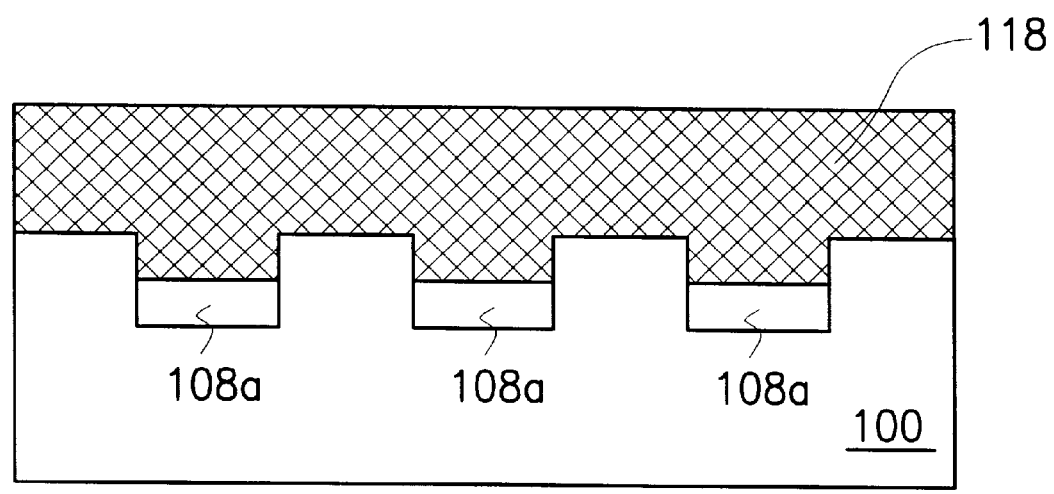

Reference is made to FIG. 1D, while simultaneously referring to FIGS. 2B, 3B, and 4B. FIG. 2B is a cross-sectional diagram of the substrate, which is perpendicular to the orientation of the opening 112 (FIG. 1C) and corresponds to the trench isolation structure 108a. FIG. 3B is the cross-sectional diagram of the substrate 100, which is perpendicular to the orientation of the opening 112 and corresponds to the masking layer 104a. FIG. 4B is the cross-sectional diagram of the substrate 100, which corresponds to the opening 112. A spacer 116 made of the insulating material is formed on a sidewall of the opening 112, while the spacer 116 does not completely cover the sidewall of the opening 112. The substrate 100 exposed by the sidewall of the opening 112 is desired to form the depth of a source/drain region 120a, which is about 0.12 to 0.18 $\mu$m. In this case, the method involves forming a conformal insulating layer on the whole surface of the substrate 100, while the material includes $SiO_x$, $SiN_x$, or the like. Anisotropic etching is performed and controlled such that the spacer 116 is formed as shown in the diagrams. The opening 112 is filled with a doped polysilicon conducting layer 118, such as the N type doped polysilicon conducting layer 118 wherein the surface of the doped polysilicon conducting layer 118 is higher than the interface of the substrate 100 and the pad oxide layer 102a. The polysilicon conducting layer 118 is therefore the buried bit line.

The dopant in the doped polysilicon conducting layer 118 is driven into the substrate 100, in order to form the source/drain region 120a in the substrate 100, which in this case is N-type. The dopant is also driven by heat diffusion into the substrate 100 at the bottom of the opening to form the doped region 120b.

As the buried bit line of the present invention is the doped polysilicon conducting layer 118, it is different from the buried bit line of the conventional doped region. Thus, it has a lower resistance to improve the speed of data transmission. Furthermore, the source/drain region 120a is formed by the heat diffusion, which is different from the conventional ion implantation. Thus, this lowers the extent to which the lattice array is damaged.

Figure 1E:
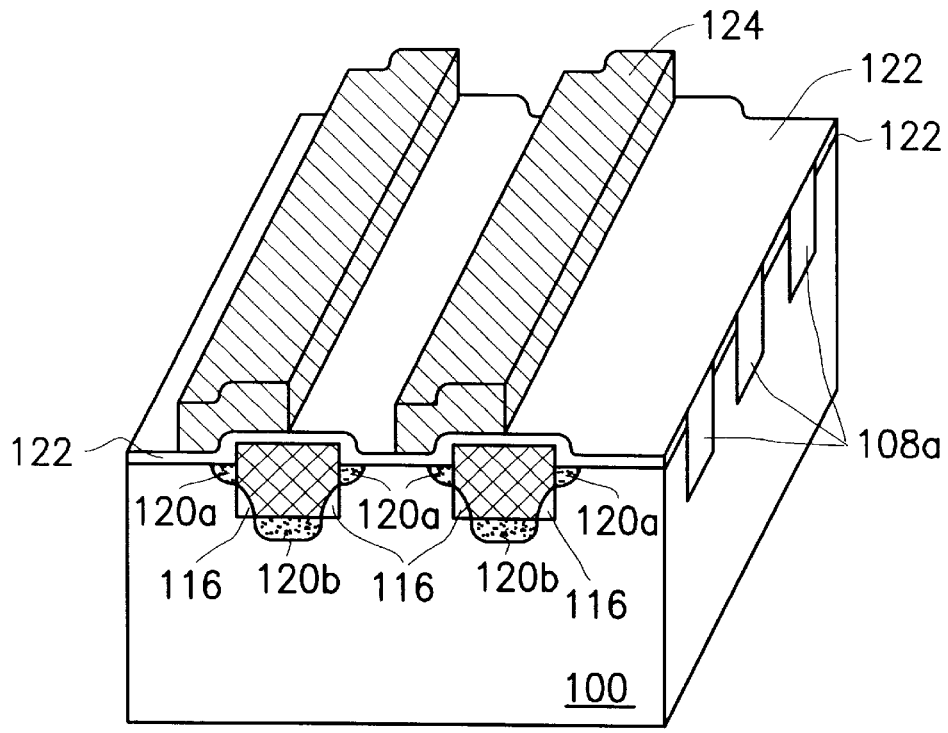

Referring to FIG. 1E, the masking layer 104a, the pad oxide layer 102a, and part of the trench isolation structure 108a are removed until the surface of the substrate 100 is exposed. A tunneling oxide layer 122 is then formed over the entire surface of the substrate 100, while a conducting layer 124 is formed on the tunneling oxide layer 122. The material in this case includes doped polysilicon. The conducting layer 124 is formed to be approximately parallel to the polysilicon conducting layer 118 (FIG. 1D) and corresponds to part of the polysilicon conducting layer 118.

Figure 1F:
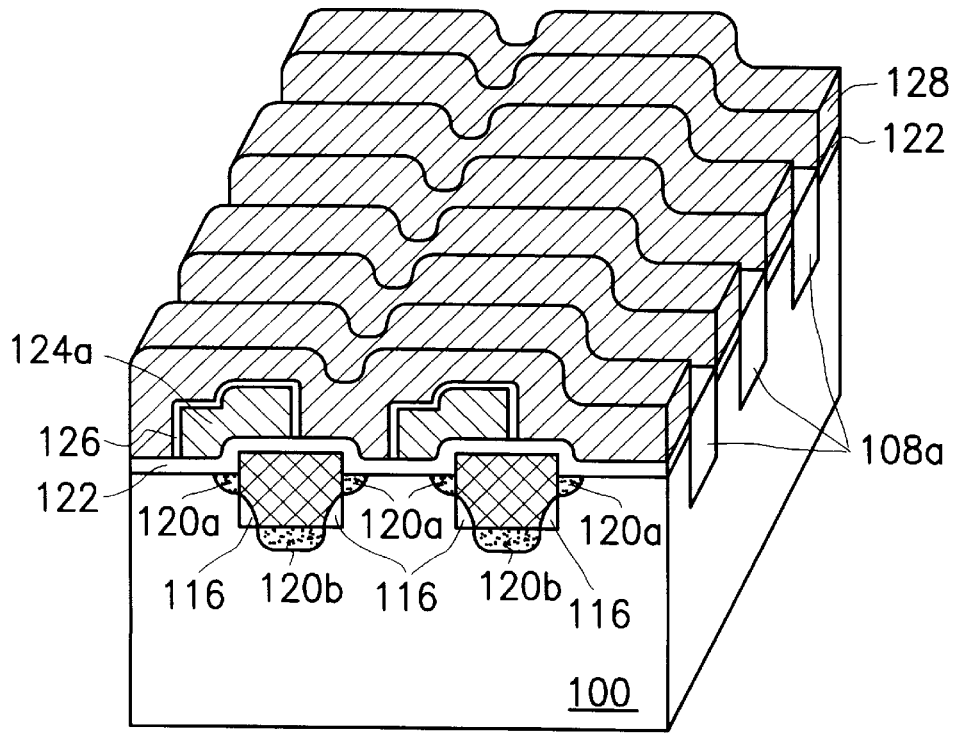

Referring to FIG. 1F, the surface of the conducting layer 124 is covered at least with a dielectric layer 126. The material in this case includes $SiO_x$—$SiN_x$—$SiO_x$, $SiO_x$ or $SiN_x$, etc. and the method involves low-pressure chemical vapor deposition (CVD). Another conducting layer is formed over the entire surface of the substrate 100. The material in this case includes the doped polysilicon. The conducting layer is patterned with the mask to define a conducting layer 128 for a control gate. While the conducting layer 128 is defined, the dielectric layer 126 and the conducting layer 124 are continually patterned using the same mask, so that the dielectric layer 126 and the conducting layer 124 are formed respectively, as shown in the diagram. The conducting layer 124a is used as a control gate. That means the gate of the flash memory is constituted by the stacked structure of the conducting layer (control gate) 128, dielectric layer 126, and the conducting layer (floating gate) 124a.

It can be understood from the invention that the depth of the source/drain region of the flash memory can be controlled by the formation of the spacer on the opening sidewall of the buried bit line. Therefore, the device has a better efficiency. The distance between the top of the spacer of the buried bit line and the interface of the substrate and the pad oxide layer is also known as the depth of the source/drain region. The source/drain region is formed by driving the dopant from the polysilicon conducting layer used as the buried bit line, thus reducing the damage to the lattice array in the substrate. The buried bit line of the invention is the doped polysilicon conducting layer and therefore has a lower resistance.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a flash memory, comprising:
   providing a substrate, wherein a first oxide layer is formed and a first masking layer is patterned on the first oxide layer;
   with the first masking layer serving as a mask, forming a plurality of strip-like trench isolation structures in the substrate;

forming a plurality of strip-like openings in the substrate, with orientation of the openings approximately perpendicular to the trench isolation structures, wherein each of the openings includes a first portion that crosses the masking layer and exposes the substrate, and a second portion that crosses the strip-like trench isolation structures and does not expose the substrate;

forming a plurality of spacers on sidewalls of the openings, wherein the spacers do not completely cover the sidewalls of the openings so that tops of the spacers within the first portion of the opening are isolated by an interface between the substrate and the first oxide layer with a distance;

filling the openings with a plurality of doped first conducting layers wherein there is a dopant in the doped first conducting layers;

with the spacers serving as masks, driving the dopant from the doped first conducting layers into the substrate through the interface to form a plurality of source/drain regions;

removing the first masking layer and the first oxide layer until the substrate is exposed;

forming a tunneling oxide layer on the substrate, the source/drain regions, and the first conducting layers;

forming a plurality of patterned strip-like second conducting layers on the tunneling oxide layer, wherein the second conducting layers are approximately aligned with the doped first conducting layers and at least correspond to the source/drain regions, respectively;

forming a dielectric layer at least on exposed surfaces of the second conducting layers;

forming a third conducting layer over the substrate; and patterning the third conducting layer to form a plurality of strip-like control gates so that an orientation of the control gates is approximately perpendicular to the doped first conducting layers, and continually defining the dielectric layer and the second conducting layers to form a plurality of floating gates.

2. The fabricating method of claim 1, wherein the spacers include an insulating material.

3. The fabricating method of claim 2, wherein the insulating material of the spacers is selected from a group consisting of $SiO_x$ and $SiN_x$.

4. The fabricating method of claim 1, wherein the distance which isolates the top of the spacers from the interface of the substrate and the first oxide layer is the depth of the source/drain regions.

5. The fabricating method of claim 4, wherein top surfaces of the doped first conducting layers are higher than the interface of the substrate and the first oxide layer.

6. The fabricating method of claim 5, wherein the method of driving the dopant from the doped first conducting layers into the substrate for forming the source/drain regions includes heat diffusion.

7. A method of fabricating a buried bit line and a source/drain region, comprising:

providing a substrate, wherein a patterned dielectric layer is formed on the substrate, and a plurality of strip-like trench isolation structures are formed in the substrate with the dielectric layer serving as a mask;

forming a plurality of strip-like openings in the substrate, with orientation of the openings approximately perpendicular to the trench isolation structures, wherein each of the openings includes a first portion that crosses the masking layer and exposes the substrate, and a second portion that crosses the strip-like trench isolation structures and does not expose the substrate;

forming a plurality of spacers on sidewalls of the openings, wherein the spacers do not completely cover the sidewalls of the openings so that tops of the spacers within the first portion of the opening are isolated by an interface between the substrate and the first oxide layer with a distance;

filling the openings with a plurality of doped first conducting layers which are used as the buried bit lines, wherein there is a dopant in the doped first conducting layers; and with the spacers serving as masks, driving the dopant from the doped first conducting layers into the substrate through the interface to form a plurality of source/drain regions.

8. The fabricating method of claim 7, wherein the dielectric layer includes $SiN_x$.

9. The fabricating method of claim 7, wherein the spacers include an insulating material.

10. The fabricating method of claim 7, wherein the distance which isolates the top of the spacers from the interface of the substrate and the first oxide layer is the depth of the source/drain regions.

11. The fabricating method of claim 10, wherein top surfaces of the doped first conducting layers are higher than the interface of the substrate and the first oxide layer.

12. The fabricating method of claim 11, wherein the method of driving the dopant from the doped first conducting layers into the substrate for forming the source/drain regions includes heat diffusion.

* * * * *